(12) United States Patent
Darras et al.

(10) Patent No.: US 6,827,972 B2
(45) Date of Patent: Dec. 7, 2004

(54) CONTAINER WITH A COATING OF BARRIER EFFECT MATERIAL, AND METHOD AND APPARATUS FOR MANUFACTURING THE SAME

(75) Inventors: David Darras, Le Havre (FR); Jean-Michel Rius, Maneglise (FR); Patrick Chollet, Lannion (FR); Naïma Boutroy, Pleumeur-Bodou (FR); Nasser Beldi, Perros-Guirec (FR); Fabrice Oge, Lannion (FR)

(73) Assignee: Sidel, Octeville sur Mer (FR)

( * ) Notice: Subject to any disclaimer, the term of this patent is extended or adjusted under 35 U.S.C. 154(b) by 0 days.

(21) Appl. No.: 10/194,249

(22) Filed: Jul. 15, 2002

(65) Prior Publication Data

US 2002/0176947 A1 Nov. 28, 2002

Related U.S. Application Data

(62) Division of application No. 09/647,005, filed as application No. PCT/FR99/00692 on Mar. 25, 1999, now Pat. No. 6,800,346.

(30) Foreign Application Priority Data

Mar. 27, 1998 (FR) .............................. 98 03824

(51) Int. Cl.[7] .............................. B05D 7/22; C23C 14/02
(52) U.S. Cl. ...................................... 427/237; 427/534
(58) Field of Search ................................ 427/230, 237, 427/238, 249.1, 249.7, 255.28, 533, 534, 535, 539, 569, 575, 577, 595, 902, 904, 906

(56) References Cited

U.S. PATENT DOCUMENTS 4,643,876 A * 2/1987 Jacobs et al. ................. 422/23
4,756,964 A   7/1988 Kincaid et al.
4,809,876 A * 3/1989 Tomaswick et al. ...... 220/62.12
5,041,303 A * 8/1991 Wertheimer et al. ......... 427/575
5,391,510 A * 2/1995 Hsu et al. .................... 438/301
5,677,010 A * 10/1997 Esser et al. .................. 427/489
5,690,745 A   11/1997 Grunwald et al.

FOREIGN PATENT DOCUMENTS

| DE | 3632748 A1 | 4/1988 | |
| DE | 43 16 349 A1 | 11/1994 | |
| DE | 44 37 050 A1 | 4/1996 | |
| EP | 0 575 299 A1 | 12/1993 | |
| EP | 0 739 655 A1 | 10/1996 | |
| EP | 0 773 166 A1 | 5/1997 | |
| EP | 0 778 089 A1 | 6/1997 | |
| FR | 2712310 A1 | 5/1995 | |
| WO | WO 95/22413 A1 | 8/1995 | |
| WO | WO-95/22413 A1 * | 8/1995 | ............ B05D/7/24 |
| WO | WO 01/47783 | 7/2001 | |

OTHER PUBLICATIONS

Pierson, Hugh O., "Handbook of Carbon, Graphite, Diamond and Fullerenes: Properties, Processing and Applications," © 1993 by Noyes Publications, Chapter 14: Diamond–Like Carbon (DLC), especially Table 14.1.*

"Radio Frequency Table" from Merriam–Webster's Collegiate Dictionary, 10th Edition, © 1998 by Merriam–Webster, Inc., p. 963.*

Definition of "glass transition temperature" from Hawley's Condensed Chemical Dictionary, 12th Edition, © 1993 by Van nostrand Reinhold, p. 563.*

(List continued on next page.)

Primary Examiner—Shrive P. Beck
Assistant Examiner—William Phillip Fletcher, III
(74) Attorney, Agent, or Firm—Sughrue Mion, PLLC

(57) ABSTRACT

The invention provides a container such as a bottle or flask, made heterogeneously from a material with a barrier effect and a polymer material, characterized in that the material with a barrier effect is an amorphous carbon material with a polymer tendency which is applied as a coating on a substrate of polymer material.

6 Claims, 2 Drawing Sheets

OTHER PUBLICATIONS

Michaeli et al. "Plasma Polymerization in Automotive Industries—A Possibility for the Reduction of Permeation in Plastic Fuel Tanks," pp. 469–476, Proceedings of the 26$^{th}$ ISATA (1993).

Danzer et al., "Influence of Selected Process Parameters on the Deposition of Polymer–Like Amorphous Hydrogenated Carbon Films in Glow Discharges," Thin Solid Films, vol. 219, (1992), pp. 119–128.

* cited by examiner

CONTAINER WITH A COATING OF BARRIER EFFECT MATERIAL, AND METHOD AND APPARATUS FOR MANUFACTURING THE SAME

This is a divisional of application Ser. No. 09/647,005 filed Sep. 26, 2000, now U.S. Pat. No. 6,800,346, which is a 35 U.S.C. §371 of international application No. PCT/FR99/00692 filed Mar. 25, 1999; the above noted prior applications are all hereby incorporated by reference.

FIELD OF THE INVENTION

The present invention relates to containers, such as bottles or flasks, of a heterogeneous structure made from a material which produces a barrier effect and a polymer material.

DESCRIPTION OF THE PRIOR ART

The disadvantage of containers made from a polymer material such as PET is that they are not impermeable to certain gases, particularly oxygen and carbon dioxide.

This is the reason why carbonated drinks gradually lose their carbon dioxide to the air through the polymer substance: the shelf life of a carbonated liquid contained in a PET bottle will not be more than a few weeks in terms suitability for sale or at most a small number of months (for example 4 to 6).

This is also the reason how oxygen in the air is able to penetrate the polymer material to come into contact with the liquid in the container, placing it at risk of oxidation accompanied by a deterioration in its properties: the shelf life of a bottle made from PET and filled with beer will not be more than a few weeks (for example 2 to 5 weeks) in terms of suitability for sale.

A known approach to this problem is to enhance the natural barrier effect of the polymer substances used to make the containers by lining the polymer wall with a layer of material which has a stronger barrier effect.

Accordingly, it has been proposed that synthetic materials in multiple layers be used for this purpose, such as those based on aliphatic polyamides and/or mixtures of different substances. The containers are then made using multi-layered preforms, in which the layer of material with a barrier effect is located between at least two layers of polymer material (for example PET). Beer bottles made in this manner will have a considerably longer shelf life (for example up to 12 months).

However, one major disadvantage of these multi-layered containers is that the layers will come unstuck from one another. In addition, making the preform, as well as making the container from the preform by blow-moulding or by stretching-blow-moulding, are quite complex processes and require certain precautions, which makes them expensive.

Another proposal is that polymer containers be treated by applying an external coating of an appropriate material such as those known as PVDC or thermo-setting resins. However, the gain in barrier effect achieved as a result is still quite low and the presence of the coating material leads to difficulties when it comes to recycling the basic polymer material.

Moreover, in all the known solutions mentioned above, the polymer material (for example PET) is left in contact with the liquid and does not offer any protection against the disadvantages incurred by this contact: possibility of certain constituents migrating from the polymer into the liquid, possibility of a chemical reaction between the polymer and liquid, acetaldehyde being transferred into the liquid, etc., all factors which are likely to give rise to organoleptic problems.

It has also been proposed that a layer of material with a barrier effect, for example hard carbon, be applied to a wall made from polymer, for example PET, using plasma (document U.S. Pat. No. 5,041,303).

Document EP 0 773 166 also mentions the possibility of forming such a layer of carbon on the internal face of the container wall.

A carbon layer deposited in this manner would, of course, remedy all the disadvantages listed above.

However, a relatively thick layer of hard carbon or diamond-like carbon (DLC) would be needed. The wall of a container made in this way would therefore have an internal layer of hard carbon DLC, which is quite rigid, and an external layer of polymer material such as PET, which is highly deformable. Due to their differing and incompatible mechanical properties, the two layers of polymer and hard carbon end up coming apart or unstuck.

Generally speaking, polymer containers with a barrier effect by implementation of one of the techniques mentioned above are not very common due to the complexity inherent in the different processes, low production rates and the high cost of manufacturing methods of this type.

SUMMARY OF THE INVENTION

The object of the invention is substantially to remedy simultaneously all the problems mentioned above, as encountered with known containers with an improved barrier effect, and to propose a container which will effectively protect its contents whilst being easy to manufacture on an industrial scale, using less complex means under acceptable economic conditions.

To this end, in a first aspect, the invention proposes a container such as a bottle or flask, heterogeneously made from a material with a barrier effect and a polymer material which, as proposed by the invention, is characterised in that the material producing the barrier effect consists of an amorphous carbon material with a polymer tendency, which is applied to a substrate of polymer material. The substrate is a blank of the container and already has the final shape of the container.

By amorphous carbon material with a polymer tendency is meant carbon containing not only CH and $CH_2$ bonds found in the hard carbon, but also $CH_3$ bonds which are absent in hard carbon (to get a rough idea, the proportions of $CH_3$, $CH_2$ and CH are respectively 0, 40 and 60 in hard carbon and 25, 60 and 15 in amorphous carbon with a polymer tendency, whereas the proportions of the electronic states $sp^3$, $sp^2$ and sp are respectively 68, 30 and 2 in hard carbon and 53, 45 and 2 in carbon of the polymer type).

Choosing an amorphous carbon material with a polymer tendency overcomes the problem caused by the rigidity of hard carbon or DLC: in practice, amorphous carbon materials with a polymer tendency have a substantially lower mechanical rigidity than that of hard carbon and the deformation capacity of a layer of such a material is comparable with that of a polymer such as PET: a container wall made as proposed by the invention using such an amorphous carbon material with a polymer tendency adhered to a substrate of polymer material such as PET will therefore be able to withstand deformation at normal levels without these two layers coming unstuck.

It is true that inherent in their physical and chemical structure, amorphous carbon materials with a polymer tendency have a lower molecular permeability coefficient than hard carbon which has been used to date and it was thought that any barrier effect they produced was less than perfect. This is one reason why they have not been considered until now and why hard carbon or DLC was used to provide layers with a barrier effect. Surprisingly, tests conducted with amorphous carbon materials with a polymer tendency have shown that the barrier effect obtained under certain operating conditions is generally sufficient in practice for use in the packaging of carbonated liquids or oxidizable liquids.

It would also be conceivable to use carbon-type nano-composites (or DLN)—i.e. composites with reciprocally interleaved dual networks, stabilised and random, one of which is a network of amorphous carbon with a polymer tendency (a-c:H, with up to 50% sp$^3$ bonds) whilst the other may be a network of silicon stabilised by oxygen (a-Si:o)— and nano-composites incorporating metal atoms.

It is of advantage if the coating of amorphous carbon material with a polymer tendency is of a thickness less than approximately 3000 Å (beyond that, too great a thickness imparts too high a mechanical rigidity to the carbonated coating, with the risk that it will rupture or become unstuck), preferably between 800 and 1500 Å.

It should be pointed out that, although still transparent at the above-mentioned thicknesses, amorphous carbon of the polymer type is amber in colour which helps to protect against ultraviolet rays (as a protection for beer in particular). It has been found that under certain operating conditions, the effectiveness of the barrier against ultraviolet afforded by this protection depends on the thickness of the coating and, interestingly, increases sharply with the intensity of ambient light (factor of about 8 in darkness but a factor of about 30 in daylight).

The polymer material, which in practical applications is a polyolefin or a polyester such as PET or PEN, may be used in a reduced thickness because of the natural rigidity of the carbon layer. On this subject, it should also be pointed out that the carbon-based coating helps to reduce deformation of the container wall when subjected to the pressure of a gaseous liquid, such as a carbonated liquid. The container therefore retains a stable shape and its interior volume remains constant: there is no change in the composition of the liquid contained in it.

Although the coating with the barrier effect may be provided on the exterior of the container blank, it is nevertheless preferable if this coating forms the internal coating of the container so that it will help to isolate the polymer material and the liquid held in the container: the barrier effect will therefore be extended and will render any migration of the polymer constituents into the liquid, any chemical reaction between the substances in the polymer and the liquid and any migration of acetaldehyde into the liquid, etc., impossible.

It should be stressed, at this point, that the principle underlying a container made as proposed by the invention is that chemical bonds are established between the superficial carbon atoms of the polymer substrate which have a free chemical bond and the atoms of the carbon material which are brought into contact with the polymer and have a free chemical bond, ready to combine with the free bond of the superficial carbons in the polymer substrate. Under these conditions, the coating of carbon material is linked to the polymer substrate by a chemical and hence extremely powerful bond; since the carbon material also has a polymer tendency as explained above, the powerful chemical bond is nevertheless accompanied by a relative capacity for deformation in the carbon coating, these two features together providing a structure which no longer exhibits the disadvantages (layers becoming unstuck in particular) of the known containers made from hard carbon or DLC.

A plasma deposition process can be used to deposit the carbon coating, with carbon atoms having a free chemical bond available for bonding with that of a superficial carbon atom in the polymer.

Accordingly, a second aspect of the invention relates to a method using a plasma excited by an electromagnetic wave to form a container, such as a bottle or flask, made heterogeneously from a material with a barrier effect and a polymer material forming a substrate conforming to the shape of said container to be produced, characterised in that said polymer material forming the substrate is coated with a material with a barrier effect comprising an amorphous carbon material with a polymer tendency, consisting of two steps:

- a blank of the container made from a polymer material forming the above-mentioned substrate is placed in an enclosure,
- at least one carbon precursor is injected into the reaction chamber in the gaseous state at a very low pressure of less than 10 mbar, the precursor being selected from the alkane, alkene, alkyne and aromatic compounds or a combination of some of them,
- a microwave in the UHF range is electromagnetically excited in the reaction chamber with a relatively low power sufficient to generate a plasma under temperature conditions which will maintain the polymer at a temperature below the glass transition temperature on the one hand and which will cause an amorphous carbon material with a polymer tendency to be deposited on the other.

In a first possible implementing method, the container blank made from polymer is closed whilst the gaseous carbon precursor is being injected into the enclosure which is then the reaction chamber, whereby the coating of amorphous carbon material with a polymer tendency is deposited on the external surface of the container blank.

In a second possible implementing method, the gaseous carbon precursor is introduced inside the container blank of polymer material, which then becomes the reaction chamber, whilst simultaneously creating a pronounced vacuum in the container blank, whereby a plasma is formed in the interior of the blank only and the coating of amorphous carbon material with a polymer tendency is deposited on the internal surface of the container blank; furthermore, in order to prevent the container from deforming due to the prevailing vacuum, a vacuum is simultaneously generated in the enclosure to reduce the pressure differential between the interior and the exterior of the blank. Moreover and by preference in this instance, the enclosure is of a transverse dimension close to that of the body of the container blank, closely conforming to the container blank, so that a means with a lower power rating can be used to generate the vacuum.

As a result of the features characterising the method proposed by the invention, a coating of amorphous carbon material with a polymer tendency can be deposited at the requisite low thickness of less than 3000 Å and in particular between 800 and 1500 Å in a short time of a few seconds and not more than about twenty seconds, with a modest microwave power in the order of a few hundred watts (for example about 200 to 600 W) producing a power density of about 0.5 to 2 watts per cubic centimeter. As a result, the corresponding increase in temperature within the polymer material of the container blank forming the substrate on which the carbon coating will be deposited (inside or outside, as is the case) remains relatively low and below the glass transition temperature of the polymer (approximately 80° C. in the case of PET).

These are the conditions under which the carbon coating is formed under the action of a microwave plasma at low pressure (not exceeding a few millibars and in practice in the order of 0.01 and 0.5 mbar) or "cold plasma", causing an amorphous carbon structure with a polymer tendency to be formed, i.e. consisting of or containing an over-hydrogenated amorphous carbon network exhibiting the advantageous properties listed above.

Apart from obtaining a container with a barrier effect which is mechanically well bonded onto the polymer substrate, the method proposed by the invention offers the notable advantage of facilitating the manufacture of sterile containers which may be used in aseptic packaging production lines.

The plasma generated during the process of depositing the carbon coating is sufficient to clean the internal surface of the container blank as desired.

In order to obtain a more intense aseptic effect, it would be conceivable to use a bactericidal agent beforehand, atomised to produce micro-droplets or introduced in vapour form, for example with a bubble system, onto the internal surface of the container blank (for example hydrogen peroxide, phosphoric acid, steam, etc.); subsequent generation of a plasma under the above-mentioned conditions will create a highly reductive medium (by generating native oxygen for example) which is capable of reducing the initial bacterial contamination so as to meet the sterilisation requirements.

In implementing the method described above, a third aspect of the invention is an apparatus which uses a plasma excited by electromagnetic wave to form a container, such as a bottle or flask, made heterogeneously from a material with a barrier effect and a polymer material forming a substrate (container blank) having the shape of said container to be produced, this apparatus comprising a plasma-generating device with an enclosure fitted with means for injecting a gaseous precursor and electromagnetic excitation means, which apparatus is characterised in that in order to coat said polymer material forming the substrate with a material having a barrier effect comprising an amorphous carbon material with a polymer tendency, the means for injecting the precursor are connected to a means for generating a precursor in the gaseous state, selected from the alkane, alkene, alkyne and aromatic compounds or a combination of some of them, in that in order to coat said polymer material forming the substrate with a material having a barrier effect comprising an amorphous carbon material with a polymer tendency, the injection means open into the enclosure and are designed to deliver the gaseous precursor at a very low pressure of less than 10 mbar, and in that the electromagnetic excitation means are of a sufficient rating to generate microwaves in the UHF range.

In a first embodiment, the dimensions of the enclosure are substantially larger than those of the container blank to be treated and injection means open into the enclosure outside the container blank, whereby, the container blank being closed, the apparatus generates a plasma outside the container blank and it is on the external surface of the container blank that the coating of amorphous carbon material with a polymer tendency is deposited.

In a second embodiment, the means for injecting the gaseous precursor open into the interior of the container blank arranged in the enclosure and pumping means are provided opening into the container blank and capable of generating a pronounced vacuum therein, whereby the plasma is generated inside the container blank and it is on the internal surface of the container blank that the coating of amorphous carbon material with a polymer tendency is deposited. In order to prevent the blank from deforming due to the vacuum prevailing in the interior, a vacuum is simultaneously created inside the enclosure to reduce the pressure differential between the interior and the exterior of the blank. Advantageously in this case, the enclosure is provided with a removable cover producing a tight seal, designed to support the injector for the gaseous precursor and the suction orifice of the pumping means; it also has support means designed to support a container blank by the neck thereof, applying the lip of said container blank against the interior face of said cover, surrounding said suction and injector orifices. It is also desirable to be able to displace the support means axially in order to apply the container blank against the interior face of the cover, capping said suction and injector orifices prior to depositing the coating, or in order to remove the finished container once the coating has been deposited.

By preference, in order to facilitate use of the pumping means and avoid having to use means of a higher capacity than necessary, the enclosure has a transverse dimension close to that of the body of the container blank.

As a result of the features proposed by the invention, in particular due to the reduced processing times, it is possible to mount a method of manufacturing a container with a barrier effect on an industrial scale, which will enable containers to be produced at a rate compatible with current requirements for packaging liquids.

BRIEF DESCRIPTION OF THE DRAWINGS

The invention will be more readily understood from the detailed description below of certain embodiments, given by way of illustration only and not restrictive in any respect. Throughout the description, reference will be made to the appended drawings, of which.

DETAILED DESCRIPTION OF THE INVENTION

Figure 1:
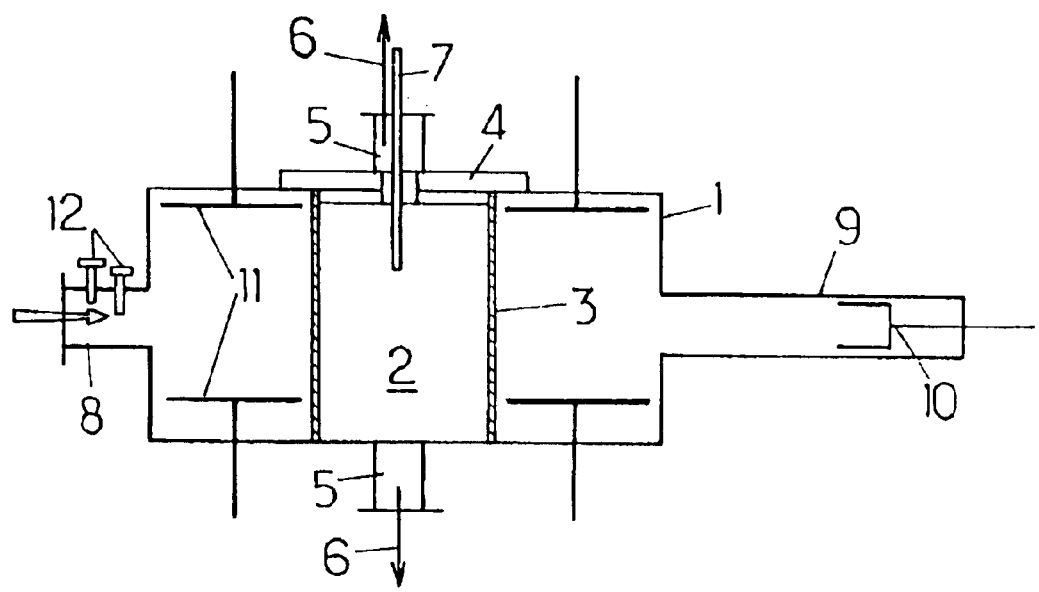
FIGS. 1 to 3 provide schematic illustrations, in section, of three respective embodiments of an apparatus enabling a container having a layer of material with a barrier effect to be produced, as proposed by the invention.

Turning firstly to FIG. 1, the apparatus comprises a cavity 1, with conductive walls, made from metal for example, the dimensions of which are selected depending on the object to be processed and the coupling mode required, surrounding an enclosure 2 defined by walls 3 made from a material transparent to electromagnetic microwaves, such as quartz for example.

The enclosure 2 is closed at the top by a removable cover 4, for example, which enables the object to be processed to be placed in the enclosure and removed after treatment.

To enable a vacuum to be generated, the enclosure 2 is connected to external pumping means (not illustrated) by means of at least one connector: in FIG. 1, two connectors 5 are provided in the base and the cover 4 respectively (pumping symbolised by arrows 6).

In order to inject at least one gaseous precursor into the enclosure 2, preferably at a pressure below 1 mbar, at least one injector 7 is provided, connected to at least one generator of gaseous or liquid precursor (not illustrated), such as a tank, a mixer or a bubble system. The injector 7 runs through the cover to which it is attached, extending coaxially inside the connector 5 of the pumping means, for example.

The cavity 1 is connected to an electromagnetic microwave generator (not illustrated) by a waveguide 8 extending radially relative to the side wall of the cavity 1. This waveguide is provided with regulating means, for example plunger screws 12, enabling the cavity to be tuned. At the opposite end (diametrically opposed if the cavity describes a cylinder as is the case in practical applications) is a section of waveguide 9 fitted with an axially displaceable tuning plunger 10 constituting a transverse short-circuiting device.

Finally, arranged respectively at the top and bottom of the cavity 1 are two annular plates 11 surrounding the enclosure 2 and constituting longitudinal short-circuits for the microwaves.

In the case where the intention is to deposit carbon on the substrate of polymer material, i.e. on the wall of the container blank made from polymer material, the gaseous precursor may be selected from the alkane (for example methane), alkene, alkyne (for example acetylene) and aromatic compounds.

The pressure within the reaction chamber (constituted either by the enclosure or by the container blank as will be explained later) must be low, preferably less than approximately 10 mbar, in practice in the order of 0.01 to 0.5 mbar.

In addition, it is crucial that the heating to which the polymer material of the substrate is subjected is kept low enough to ensure that the glass transition temperature of the polymer is not reached (which is in the order of 80° C. in the case of PET, for example). It is therefore necessary to use a very low microwave power for the deposition reaction, for example of a few hundred watts at most with microwaves in the UHF range (for example in the order of 2.45 GHz).

As a result of the deposition conditions, in particular the low temperature at which the carbon is deposited, a highly hydrogenated amorphous carbon is produced, containing not only the CH and $CH_2$ radicals but also a notable fraction of $CH_3$ radicals. The carbon produced is therefore one with a polymer tendency or "soft" carbon, which is less rigid than hard carbon or DLG. This layer of carbon with a polymer tendency is therefore capable of deforming, which makes it capable of conforming to deformation of the polymer forming the substrate, insignificant though it may be. This results in an improved mechanical coupling of the polymer substrate with the carbon and the risk of unsticking is therefore sharply reduced, even eliminated.

However, it should be pointed out that although it is less rigid than hard carbon or DLC, carbon with a polymer tendency or "soft" carbon also retains a significant rigidity which in any event is considerably higher than that of the polymer forming the substrate. This being the case, it would be conceivable to use the carbon layer for functional purposes as a means of imparting some of the intrinsic rigidity to the finished container; consequently, it may be that the polymer substrate does not have to provide the function of mechanical strength within the container to a certain extent. The thickness of the polymer substrate can be duly reduced and the quantity of polymer used to manufacture each container therefore reduced accordingly.

Furthermore, the fact of providing the carbon layer reinforces the mechanical strength of the container and, as a result, reduces or even eliminates the deformation capacity of a container filled with a highly carbonated liquid: the shape and thus the volume of the container remain stable, thereby preventing part of the gas from being released from the liquid.

Clearly, the advantages outlined above are additional to the fundamental advantage primarily sought, which is to produce a barrier effect, in particular against gaseous exchanges between the liquid contained in the container and the ambient atmosphere.

Finally, due to the implementing features proposed by the invention, the deposition process can be operated at a rate of several hundred Angström per second, achieving a processing time in the order of a few seconds, which will be perfectly compatible with industrial manufacturing processes.

Clearly, other embodiments of the apparatus would be conceivable as a means of generating the plasma needed to deposit the layer of amorphous carbon material with a polymer tendency, sought in the context of this invention.

Figure 2:
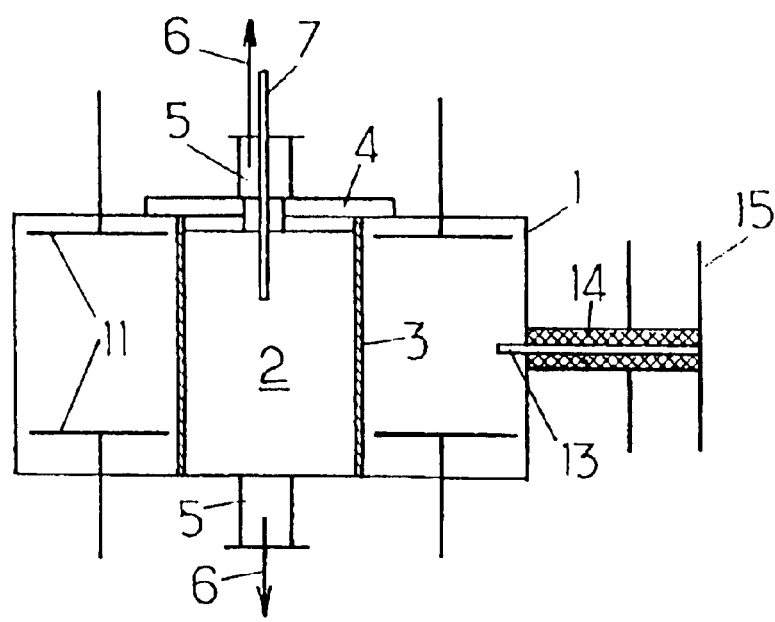

For example, the embodiment illustrated in FIG. 2, whilst retaining the same design of cavity 1 and enclosure 2 (the same reference numbers are used to denote elements which are the same as those illustrated in FIG. 1), the microwave in this case is excited by an antenna 13 which penetrates the cavity 1 radially through the side wall thereof and which is connected to a waveguide in transverse mode by a coaxial conductor 14.

Figure 3:
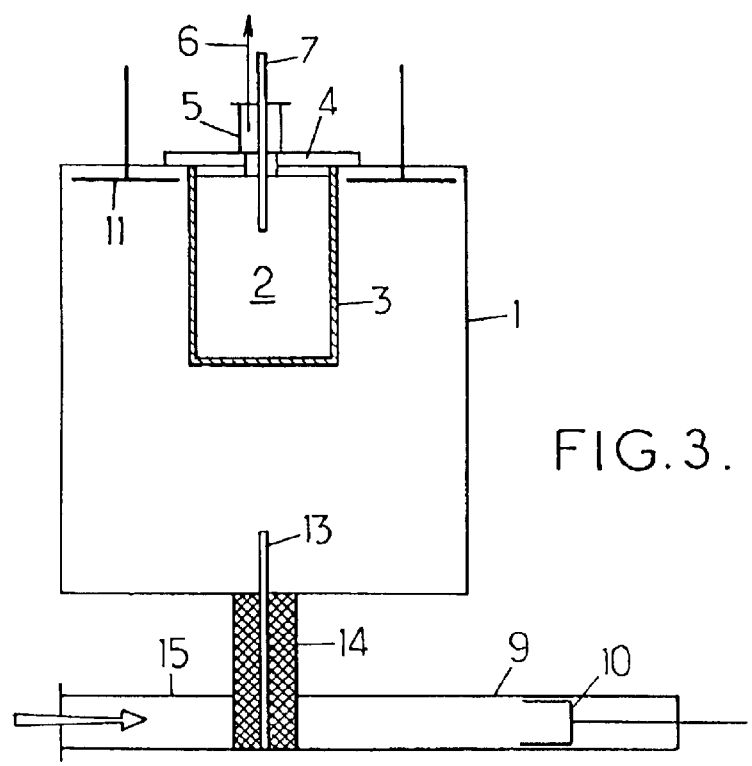

FIG. 3 illustrates another embodiment with an axial microwave cavity using an antenna 13, which is mounted in the base of the cavity 1, substantially transversely to said base and more or less coaxial with the enclosure 2. The longitudinal short circuit in this case is achieved by the top annular plate 11 only, whilst a single pumping orifice 5 is provided in the enclosure 2.

The various embodiments of the apparatus described above enable the carbon material to be deposited on the external face of the container blank made from polymer material: this being the case, the volume of the enclosure 2 is markedly bigger than that of the container blank so as to allow the plasma to build up, the container blank being stoppered to prevent any deposition on the interior.

However, as mentioned above, an external coating of carbon material procures only a partial barrier effect which does not prevent interactions between the polymer of the substrate and the contents, generally liquid.

A total barrier effect can therefore be produced only if a coating with a barrier effect is applied to the substrate inside the container. The processing apparatus needs to be modified in order to produce an internal coating of this type.

Figure 4:
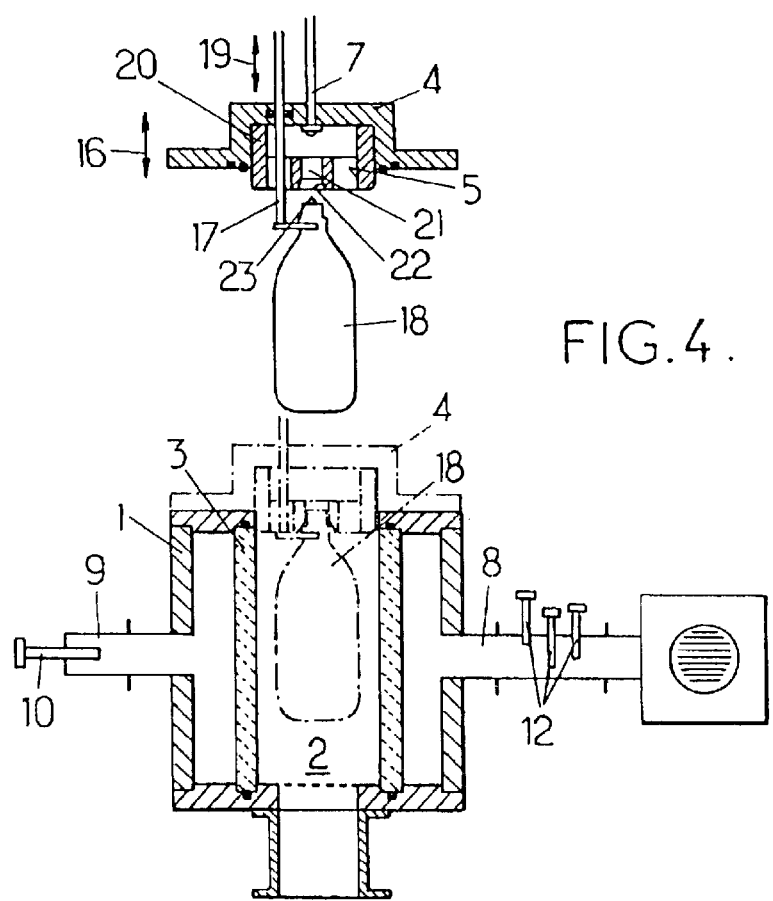
FIG. 4 is a section view of a preferred embodiment of the apparatus illustrated in FIG. 1, set up with a view to forming a layer of material with a barrier effect on the interior of the container.

FIG. 4 illustrates an embodiment of the apparatus illustrated in FIG. 1, designed to deposit an internal layer of carbon. The enclosure 2 is preferably of a shape such that its transverse or diametral dimensions are slightly larger than those of the container blank to be processed, so as to facilitate the process of placing the enclosure under vacuum as described below. In order to prevent the blank from deforming due to the vacuum prevailing inside, a vacuum is simultaneously created inside the enclosure to reduce or even cancel out the pressure differential between the interior and the exterior of the blank.

The cover 4, which is vertically mobile (double arrow 16) enabling the container blank to be positioned and the treated blank to be removed, has a vertical support arm 17 running through it for the container blank 18; this arm is vertically mobile (double arrow 19) and optionally may rotate.

The cover 4 has an internal packing 20 provided with an axial passage 21 into which or facing which the injector 7 for the gaseous precursor opens. At its bottom end, the axial passage 21 is shaped to form a seat 22 designed to receive and essentially seal the lip 23 of the neck of the container blank 18 with a view to axially positioning the container blank accurately. The packing 20 also has an annular opening, through which said support arm 17 passes, communicating with the central passage 22; this opening forms the suction orifice 5 in the direction of the pumping means to establish the vacuum. To ensure that the conditions conducive to establishing the plasma occur in the container blank only, a pronounced vacuum is established therein at the same time as said compensating vacuum is established in the enclosure.

As a result of this layout, a plasma can be created inside the container blank, which therefore acts as the actual reaction chamber, enabling an internal deposit of carbon material to be applied.

By way of example, the apparatus illustrated in FIG. 4 was operated using acetylene as the gaseous precursor, introduced into the neck of the container blank by an injector with a 4 mm diameter at a rate of 80 sccm and at a pressure of 0.25 mbar. The residual pressure inside the blank is in the order of 0.2 mbar and it was found that a residual pressure of 50 mbar inside the enclosure was enough to prevent any deformation in the blank under these conditions. Excitation was by microwaves in the UHF range at a frequency of 2.45 GHz (that is to say a wavelength λ=12 cm under vacuum); the microwave output is in the order of 180 W. Under these conditions, it proved possible to apply a carbon deposit at a growth rate in the order of 250 Å/s, i.e. to obtain a coating with a thickness of 1500 Å in a time of about 6 seconds.

In a second example, a piece of apparatus of the type illustrated in FIG. 4 was used, injecting acetylene into the container blank at a rate of about 160 sccm at a pressure of about 0.1 mbar. In this case, with a microwave output of about 350 W for a half-liter bottle or about 500 W for a one-liter bottle, an effective barrier coating was produced in a time of about 2 to 3 seconds.

Depending on the processing conditions (duration in particular), using plasma for the process of manufacturing the container provides a simple means of cleaning or disinfecting (sterilisation) the interior of the container in plants operating a container production, filling and sealing line in an aseptic environment.

The plasma generated whilst the carbon layer is being deposited may be sufficient to clean the internal surface of the blank to an initial degree.

For a more intensive treatment, a simple oxygen plasma may be used, created from reactive species, such as metastable species, atomic or molecular oxygen for example, which are capable of reducing the initial bacterial contamination by the action of their natural energy to a sufficient degree to meet health criteria.

These treatments are carried out in times of less than ten seconds, which is compatible with industrial installations.

In order to obtain a high degree of sterilisation, it will be necessary to use a bactericidal agent such as hydrogen peroxide $H_2O_2$, on which, after a predetermined contact time with the blank, an oxygen plasma is allowed to act: the physical-chemical phenomena generated by the plasma in the hydrogen peroxide-oxygen mixture generate the reactive species mentioned above along with others which are significantly reductive and have a powerful anti-bacterial effect.

Plasma treatment may also be considered as a means of removing a bactericidal agent such as phosphoric acid which is a reducer.

At this point, it should be stressed that, independently of its function as a bactericide, hydrogen peroxide also creates free radicals among the carbon atoms of the polymer present at the surface of the substrate: as a result, an increased number of free radicals is produced at the polymer surface susceptible to receiving carbon atoms deposited on the surface, thereby strengthening the chemical bonds established between the polymer and the carbon deposited on its surface. Consequently, it would also be conceivable to spray the surface of the substrate with hydrogen peroxide prior to depositing the carbon coating in a plasma atmosphere, before subjecting it to an oxygen plasma in order to improve adherence of the carbon coating to the polymer.

What is claimed is:

1. A method using a plasma excited by an electromagnetic wave to form a container made heterogeneously from a material with a barrier effect and a polymer material forming a substrate conforming to the shape of said container to be produced, wherein said polymer material forming the substrate is coated with a material with a barrier effect comprising an amorphous carbon material with a polymer tendency, comprising the following steps:

placing a container blank (18) made from a polymer material forming the above-mentioned substrate in an enclosure (2), in which a vacuum is created, injecting at least one carbon precursor into the container blank (18) which constitutes a reaction chamber (18) at the same time as a vacuum is created inside said blank and a vacuum is simultaneously created into the enclosure in order to reduce the pressure differential between the interior and the exterior of the blank, said carbon precursor being injected in the gaseous state at a pressure of less than 10 mbar, the precursor being selected from the group consisting of alkane compounds, alkene compounds, alkyne compounds, aromatic compounds, and a combination of two or more thereof, and simultaneously electromagnetically exciting a microwave in the UHF range in the container blank, at a relatively low power sufficient to generate a plasma in the interior of the blank only, such plasma being under temperature conditions which will maintain the polymer material forming the substrate at a temperature below its glass transition temperature on the one hand and which will cause an amorphous carbon material with a polymer tendency to be deposited on the interior surface of the container blank on the other hand, wherein said amorphous carbon material with a polymer tendency is a material wherein $CH_3$, $CH_2$, and CH bonds are in the proportions of 25, 60, and 15, respectively, and the proportions of the electronic states $sp^3$, $sp^2$, and sp are 53, 45, and 2, respectively.

2. A method as claimed in claim 1, wherein the enclosure (2) is of a transverse dimension close to that of the body of the container blank (18) so as to conform closely to the container blank in order to make it easier to create a vacuum in the enclosure.

3. A method as claimed in claim 1, wherein the gaseous carbon precursor is injected at a pressure of less than 1 mbar.

4. A method as claimed in claim 1, wherein before the internal coating of amorphous carbon material with a polymer tendency is formed, an oxygen plasma is formed inside the container blank (18) conducive to generating native oxygen in order to clean the container blank.

5. A method as claimed in claim 1, wherein before the internal coating of amorphous carbon material with a polymer tendency is formed, a bactericidal agent is atomised inside the container blank (18), after which an oxygen plasma is formed, whereby the plasma generates a highly reductive medium conducive to reducing bacterial contamination.

6. A method as claimed in claim 1, wherein the container is a bottle or flask.

* * * * *